(12) United States Patent
Young

(10) Patent No.: US 6,974,971 B2
(45) Date of Patent: Dec. 13, 2005

(54) MATRIX ARRAY DEVICES WITH FLEXIBLE SUBSTRATES

(75) Inventor: Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 607 days.

(21) Appl. No.: 10/084,723

(22) Filed: Feb. 25, 2002

(65) Prior Publication Data

US 2002/0139981 A1 Oct. 3, 2002

(30) Foreign Application Priority Data

Apr. 3, 2001 (GB) .............................................. 0108309

(51) Int. Cl.⁷ ........................ H01L 29/06; H01L 29/15; H01L 29/04; H01L 31/036; G02F 1/1343
(52) U.S. Cl. .......................... 257/72; 257/39; 349/139; 349/143; 349/149
(58) Field of Search ............................. 257/39, 72, 59; 349/42, 43, 139, 143, 149

(56) References Cited

U.S. PATENT DOCUMENTS

| | | | |
|---|---|---|---|
| 5,130,829 A | 7/1992 | Shannon ...................... 359/59 |
| 5,776,803 A | 7/1998 | Young ......................... 438/149 |
| 5,821,138 A * | 10/1998 | Yamazaki et al. .......... 438/166 |
| 5,821,688 A * | 10/1998 | Shanks et al. .............. 313/498 |
| 6,197,663 B1 | 3/2001 | Chandross et al. ......... 438/455 |
| 6,323,832 B1 * | 11/2001 | Nishizawa et al. ........... 345/83 |

FOREIGN PATENT DOCUMENTS

WO   WO0046854   10/2000   ........... H01L/27/00

OTHER PUBLICATIONS

Merriam Webster's Collegiate Dictionary 10th edition pp. 371 & 885.*
N.D. Young et al, "AMLCDs and Electronics on Polymer Substrates", SID Proceedings Euro Display 1996, pp. 555 to 558.

* cited by examiner

Primary Examiner—Nathan J. Flynn
Assistant Examiner—Victor A. Mandala, Jr.

(57) ABSTRACT

A matrix array device, for example, an active matrix display device, image sensor, or the like, comprises a matrix circuit (12, 14, 16, 18) carried on a flexible substrate (20) which circuit includes an array of semiconductor devices (12), such as TFTs, occupying discrete areas. Selected regions of the substrate (20) away from the semiconductor devices (12) are formed as areas of weakness to encourage flexing of the substrate to occur preferentially at those regions upon bending of the device and so reduce the risk of damage to the semiconductor devices. The regions, for example, may comprise lines of weakness (50, 52) extending between the semiconductor devices and may be formed by localized thinning of the substrate or by treating the substrate material to modify its stiffness at predetermined areas.

15 Claims, 5 Drawing Sheets

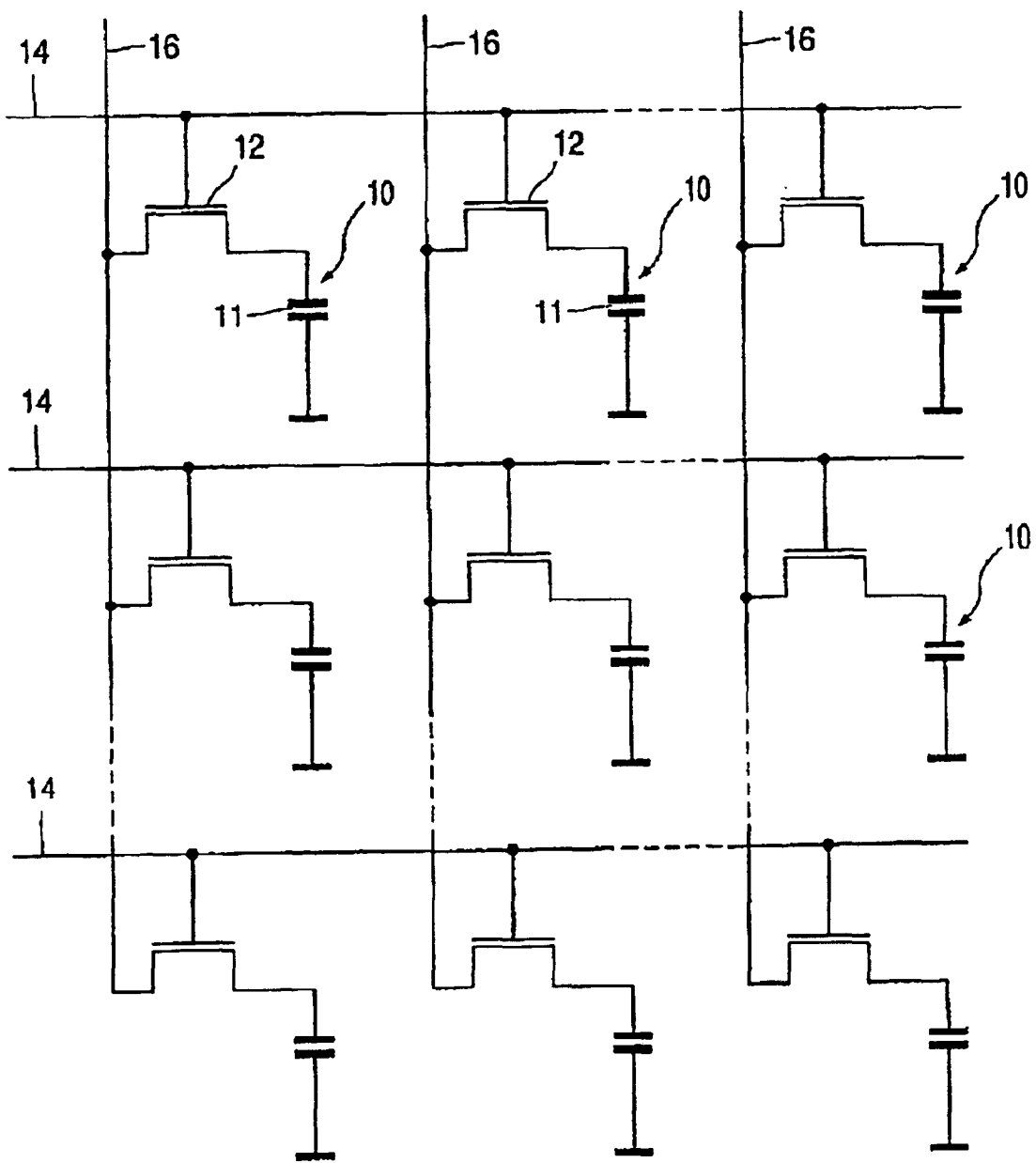
FIG. 1 [PRIOR ART]

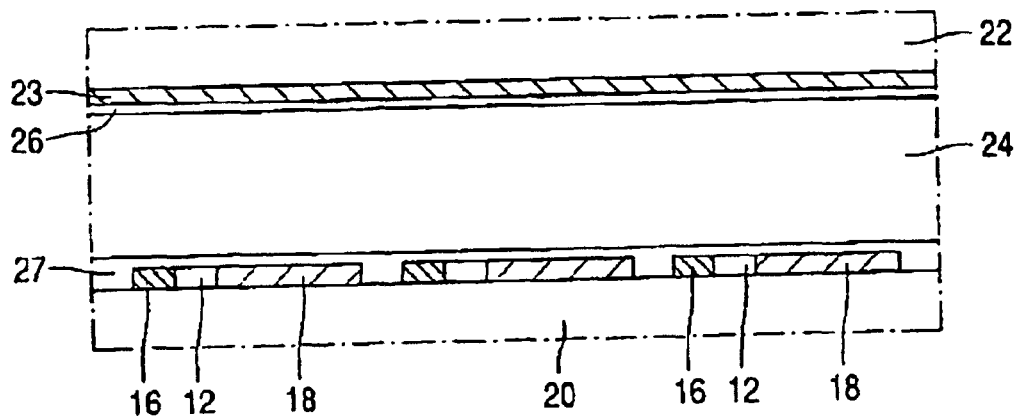
FIG. 2 [PRIOR ART]
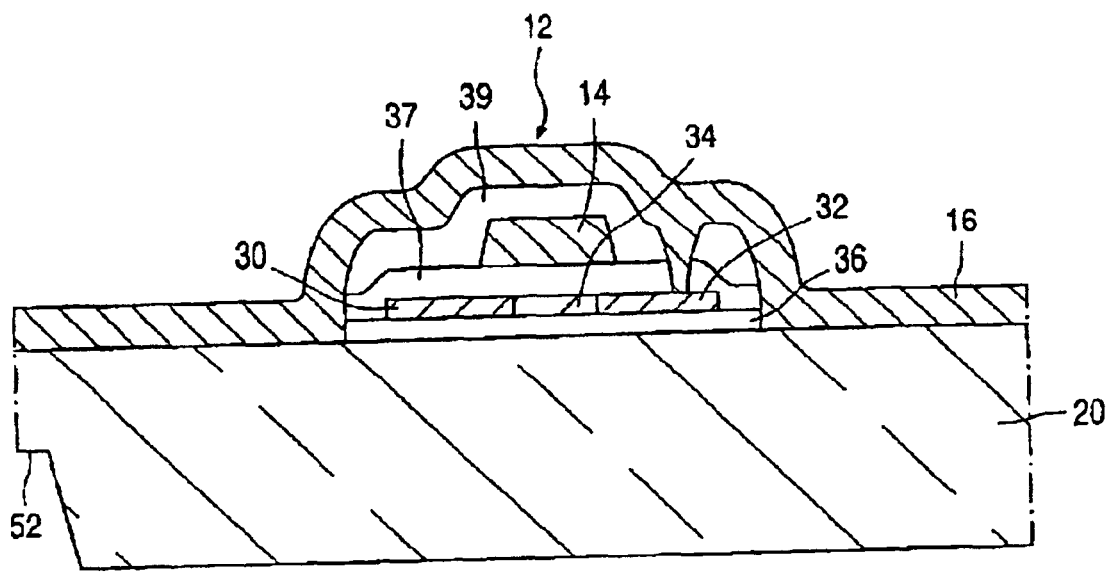
FIG. 5

MATRIX ARRAY DEVICES WITH FLEXIBLE SUBSTRATES

This invention relates to matrix array devices comprising a thin film matrix circuit including semiconductor devices carried on a flexible substrate. The device may be an image sensor, or a flat panel display, for example a liquid crystal display, or other kind of large area matrix electronics device such as a thin film data store or memory device, a thermal imaging device or a touch or fingerprint sensing array device.

There is currently considerable interest in developing thin film matrix circuits with thin film transistors (TFTs), thin film photodiodes, or other semiconductor circuit elements on inexpensive substrates for large area electronics applications. There is interest also in developing flexible devices using flexible substrates such as insulating polymer materials or metal foils rather than glass as conventional so as to provide, for example, curved displays or other matrix array devices instead of simply flat devices for ergonomic design, aesthetic or other reasons, for example in stylised television receivers using unconventional cabinet shapes, portable display equipment, children's toys and displays for vehicles where it may be desirable for the device to conform with the shape of the object in which it is incorporated. For such purposes, the device may be permanently formed into the required shape, for example by a moulding process. Alternatively the device may simply be flexible so that it can be repeatedly folded or rolled up, which has attractions especially for space saving in portable products. Examples of matrix array devices on flexible substrates and their method of fabrication are described in the paper by N. D. Young et al entitled "AMLCDs and Electronics on Polymer Substrates", SID Proceedings Euro Display 1996, pages 555 to 558 the contents of which are incorporated herein by reference.

A typical active matrix liquid crystal (LC) display device, for example as described in U.S. Pat. No. 5,130,829, comprises a pair of substrates, at least one of which is of transparent material, which are sealed together around their periphery and between which LC material is disposed, with spacing elements being distributed between the substrates to maintain a desired separation. One substrate carries on its inner surface an active matrix, thin film, circuit defining a row and column array of individually—addressable pixels which each comprise a semiconductor switching element, typically a TFT, (thin film transistor) and a transparent or reflective pixel electrode. Each pixel is located at a respective intersection between sets of row and column address lines that extend between the rows and columns of pixels with the TFT connected between associated row and column lines and its pixel electrode. The other substrate usually carries on its inner surface a transparent electrode common to all pixels in the array and, in the case of a colour display, an array of colour filter elements. The TFTs forming the semiconductor switching elements in the cell matrix are normally fabricated as respective, separate, semiconductor islands of amorphous or polycrystalline silicon material or a plastics organic material defined by patterning a continuous semiconductor layer deposited over the substrate to leave discrete areas of semiconductor material arranged in a row and column matrix.

When fabricating flexible devices, polymer material is commonly used for the substrates for reasons of low cost, low weight, and physical flexibility. An example of an active matrix array device using such is described in U.S. Pat. No. 5,776,803. Matrix array devices of this kind are capable of being bent around an axis, i.e in a cylindrical sense, either permanently or temporarily, for example to enable them to be rolled up for space saving when not in use. Such bending can generally be performed reasonably reliably with little risk of damage if the semiconductor islands are sufficiently small, in comparison with the bending radius, as to be largely unaffected by such bending. When formed of metal, the interconnecting address lines and the pixel electrodes can tolerate being bent in this manner. The ability of the metal lines, and also the pixel electrodes in the case where they comprise a transparent conductive material such as ITO, to withstand the effects of such bending can be improved by printing these components in an elastic form.

However, damage can often be caused when bending or flexing the device, and particularly when bending the device other than around a single axis, for example when forming the device into a part spherical shape. The deformations in this case tend to be larger and it has been found that damage, particularly strain-induced cracks, can occur in the thin film layers, and especially the semiconductor and dielectric layers used for the semiconductor elements, even when patterned into comparatively small islands.

According to one aspect of the present invention there is provided a flexible matrix array device comprising a thin film matrix circuit carried on the surface of a flexible substrate which matrix circuit includes semiconductor devices arranged in a regular array and occupying respective, discrete, areas of the substrate, wherein selected regions of the substrate away from the areas occupied by the semiconductor devices comprise areas of weakness at which flexing of the substrate occurs more readily.

According to another aspect of the present invention, there is provided a curved matrix array device comprising a thin film matrix circuit carried on the surface of a substrate which matrix circuit includes semiconductor devices arranged in a regular array and occupying respective, discrete, areas of the substrate, wherein the substrate comprises areas of weakness at selected regions away from the semiconductor devices and the curvature of the device is accommodated substantially by deformation of the substrate at those selected regions. Such a device may be formed, for example, by moulding an initially flat device permanently into a curved shape.

By deliberately arranging selected, and thus predetermined, regions of the substrate to be weaker, then bending or flexing of the substrate from an initially flat form is encouraged at those regions in preference to other parts of the substrate and as these regions are arranged at areas away from the semiconductor islands forming the semiconductor devices, deformation at those islands, and consequential damage to their component layers, is less likely to occur when bending or flexing the substrate. Dimensional changes in the substrate resulting from bending are thus caused to occur anisotropically and in areas where they can be tolerated, e.g. only in comparatively bare substrate regions, rather than in regions where semiconductor devices are present.

The weakened regions may be produced by localised thinning of the substrate, for example by etching or the like. In another example, the thinning may conveniently be achieved by using a multi-layer (two or more) substrate structure, one of which is patterned, preferably after fabrication of the matrix circuit. Alternatively, and particularly when using a polymer substrate, the mechanical or thermal properties of the substrate material may be deliberately modified at those regions. For example, in the case of the substrate comprising a polymer material, the polymer may be softened at the regions concerned by exposure to a solvent. Conversely, the polymer material may be deliberately stiffened, for example by exposure to radiation, over the areas other than at the regions which are to be comparatively weaker and particularly the areas on which the semiconductor devices are carried so as to assist differential bending. Alternatively, the softening point of the polymer material may be increased other than at those regions by radiation exposure to assist differential moulding.

The weakened regions may comprise lines of weakness extending over the areas of the substrate between the semiconductor devices. Where the semiconductor devices are arranged for example in a row and column array, these lines may extend between, and spaced from, rows and/or columns of the semiconductor devices. Lines extending in one direction, for example between rows, would facilitate cylindrical rolling of the device. Lines extending in orthogonal directions between rows and columns would facilitate more complex bending, as required for example for spherical moulding.

The lines of weakness can conveniently be formed by locally reducing the thickness of the substrate at those regions.

Alternatively, the areas of the substrate underlying of the semiconductor islands may be formed with a comparatively greater stiffness, for example by making the thickness of the substrate at areas underlying these islands greater than thickness of the remainder of the substrate.

In the case of the device comprising a display device having a further, spaced, substrate then this further substrate can similarly be provided with lines of weakness. These links of weakness preferably extend overlying regions between rows and/or columns of pixel electrodes on the first-mentioned substrate.

Embodiments of matrix array devices, and in particular active matrix liquid crystal display devices, in accordance with the present invention will now be described, by way of example, with reference to the accompanying drawings, in which:

FIG. 1 shows schematically the circuit of part of a typical active matrix liquid crystal display device;

FIG. 2 is a schematic cross-sectional view through part of a known active matrix liquid crystal display device;

FIGS. 4 and 5 are schematic cross-sectional views along the lines A—A and B—B of FIG. 3 respectively;

It should be appreciated that the figures are merely schematic and have not been drawn to scale. The same reference numbers are used throughout the figures to denote the same or similar parts.

Figure 3:
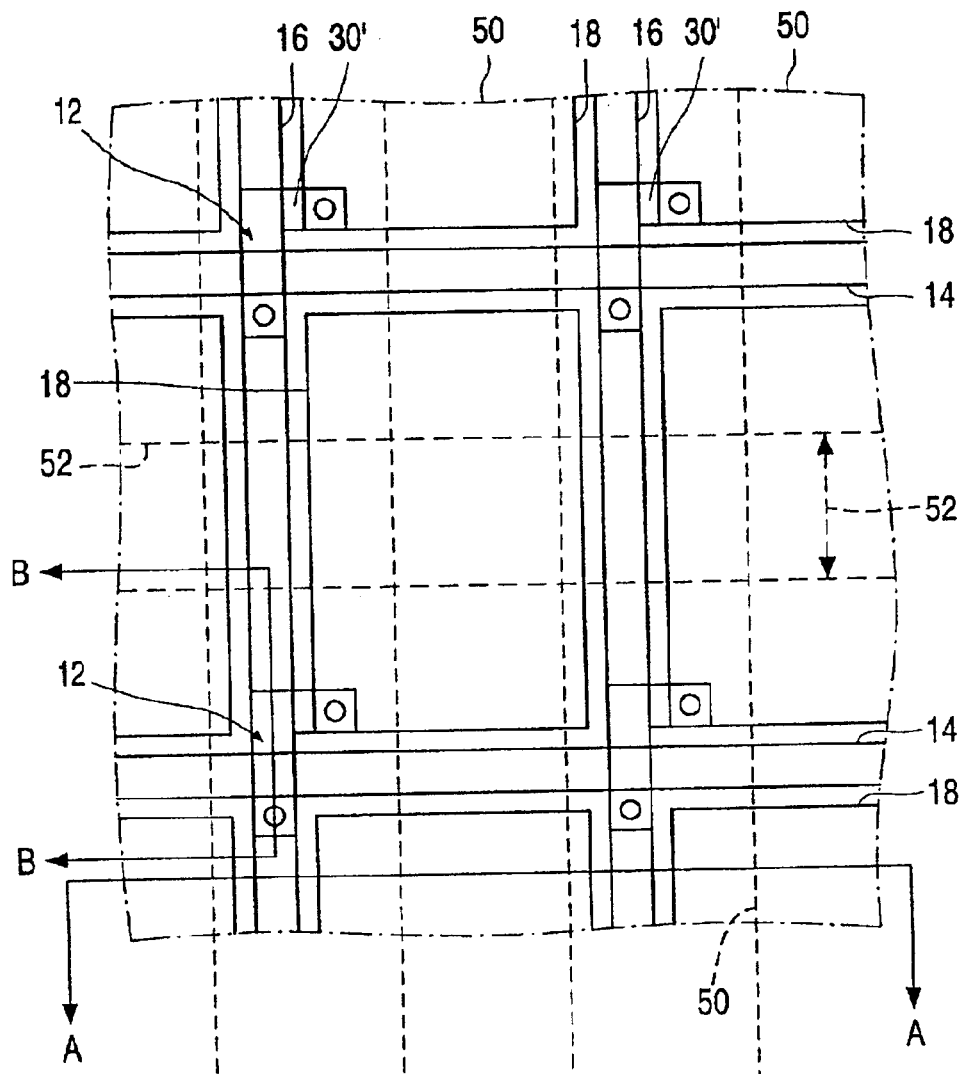
FIG. 3 is a plan schematic view of part of the active matrix substrate in one embodiment of an active matrix liquid crystal display device using the present invention.

Referring to FIG. 1, the active matrix liquid crystal display device (AMLCD) comprises a row and column, regular, array of display pixels 10, each comprising a liquid crystal display element 11 and an associated thin film transistor, TFT, 12. Each pixel is arranged adjacent the intersection of respective ones of sets of row and column address conductors 14 and 16 to which, in use, selection (gating) and data signals are supplied respectively by a peripheral drive circuit (not shown) to drive the pixels and cause their display elements to produce desired display outputs.

Referring to FIG. 2, the sets of address conductors 14 and 16, the TFTs 12 and individual pixel (display element) electrodes, 18, together form a thin film active matrix circuit which is carried on the flat surface of a substrate 20 of flexible and compliant polymer material and formed by depositing and patterning appropriate layers of conductive, insulating and semiconductive materials. In the particular section shown the row conductors 14 are not visible. Usually, a metal is used for the address conductors 14 and 16 and the electrodes 18 may be of metal or a transparent conducting material such as ITO or PEDOT polymer depending on whether the pixels are reflective or transmissive respectively. An opposing substrate 22, similarly of flexible polymer material, carries a continuous, transparent, electrode 23 common to all display elements in the array and is spaced by spacers (not shown) from the substrate 20. LC orientation films 26 and 27 are provided as continuous layers covering the structures carried on the substrates 22 and 23 respectively. The two substrates are sealed together around their periphery and liquid crystal material 24 is contained between them. The aforementioned paper by N. Young et al describes typical processes and materials for fabricating an AMLCD using polymer substrates and reference is invited to this paper for further details in these respects.

As is described in that paper, then typically the substrate carrying the active matrix circuit can comprise polymer materials such as polyimide, polyethersulphone, polyarylate, high temperature polyestercarbonate, polyethylenenapthalta and polyethyleneterephtalate, and of which can have a film thickness of around 100–200 $\mu$m. As is also described in that paper the semiconductor layers for the distributed TFTs are provided as discrete islands formed by patterning a continuous layer, with each island occupying a comparatively small area adjacent the intersection of the associated row and column address conductors.

Such a display device is formed initially as a flat, planar, structure and generally may be bent around a linear axis in a cylindrical sense, either permanently or temporarily, to form a gently curved display usually without undue problem, provided that the radius of curvature involved is not too small. However, damage may occur. If a more complicated shape is required, for example a part spherical shape in which the device needs to be bent around more than one axis, then greater distortion of the substrates is entailed. Resulting large dimensional changes to the substrates, particularly that carrying the active matrix circuitry, can lead to cracking of the thin film coatings on its surface, and especially the semiconductor materials of the TFTs even though these are patterned into small islands. The same may apply to insulating and dielectric films, although metal layers, being generally more ductile, can tolerate such bending to a greater extent and are less susceptible to damage. The metal layers, and a layer of ITO if this material is used for the pixel electrodes, could be printed in an elastic form which would be more able to withstand the effects of substrate bending, if desired.

In order to alleviate this kind of problem, the flexible polymer substrate 20 carrying the active matrix circuitry is designed to cause dimensional changes resulting from bending or flexing of the substrate from its initial flat form to occur anisotropically, and more especially to encourage such changes to occur preferentially in the substrate at selected regions away from areas carrying the active semiconductor devices. Other areas of the substrate, and particularly the areas on which the TFT devices are situated, will then tend to see less deformation and strain upon bending or flexing of the substrate.

The substrate can be modified or structured in various different ways to this end. Particularly preferred techniques comprise localised thinning of the polymer material of the substrate at selected regions where distortion and dimensional changes can be better tolerated, by altering the thermal or mechanical properties of the polymer material in those regions, or by a combination of both these approaches. For example, the polymer may be stiffened (for differential bending) or its softening point may be increased (for differential moulding) by exposure to radiation, for example U-V radiation or an ion beam. Conversely, a solvent could be used deliberately to soften the polymer at selected regions.

Thinning of the polymer may be simply accomplished by an oxygen plasma or wet etching process. Alternatively, a similar result could be achieved by using a substrate having a two layer, laminated, structure, one layer of which is patterned to define thinner regions.

Figure 4:
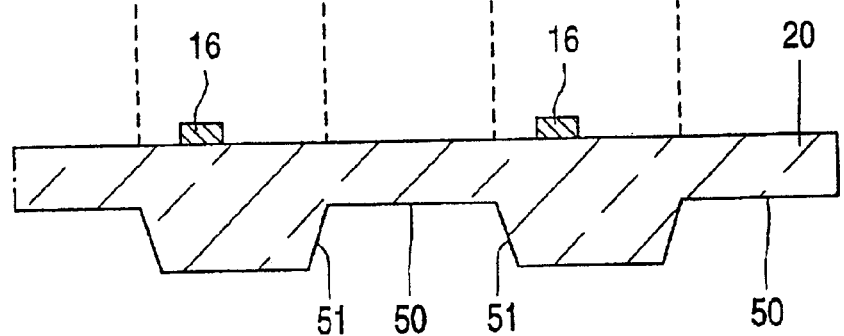

A first exemplary embodiment of a display device using a polymer substrate with localised areas of weakness obtained in particular by thinning is illustrated schematically in FIGS. 3, 4 and 5 which show respectively a representative part of the active matrix substrate in plan view, a cross-section along the line A—A and a cross-section along the line B—B at the region of a TFT respectively.

As shown in FIG. 3, a typical pixel 10 comprises a pixel electrode 18 situated between adjacent portions of crossing row and column address conductors 14 and 16. The pixel electrode 18 is connected to the drain of an associated pixel TFT 12 formed at the cross-over region between the pixel's associated row and column address conductors with the gate and source electrodes being connected respectively to the row and the column address conductor. In this particular example, the TFT 12 mainly underlies the column conductor, thereby providing a compact arrangement and allowing an increased pixel aperture, but other arrangements, for example with the TFT being positioned laterally of, but closely adjacent, the row and column conductor cross-over, can be used if desired.

FIG. 5, showing a cross-section along the line B—B, illustrates the general structure of the TFT 12. A semiconductor layer 30 in the form of a patterned, physically discrete, island, and comprising doped (n+) source and drain contact regions 32 and 33 with an intermediate intrinsic region 34 constituting a channel region, is formed on the surface of an insulating layer 36, for example of silicon oxide or nitride, carried on the planar surface of the substrate 20 and similarly patterned into an island. Extending over the semiconductor layer 30 is a gate dielectric layer 37, e.g of silicon nitride. The subsequently formed row address conductor 14, for example of a metal such as aluminium or chromium, extends over this layer above the intrinsic region 34 and serves as the gate.

An insulating layer 39, again of silicon nitride or oxide, is disposed over the gate and the exposed parts of the gate dielectric layer 37. The column address conductor 16, again of a metal such as aluminium, extends over this structure and is connected to the source contact region 32 through a contact via formed in the layers 37 and 39. Thus, the TFT comprises a series of superimposed thin film layers patterned into an island and occupying a discrete area at the region of the cross-over between the pixel's associated row and column address conductors.

The drain contact region 30 of the TFT includes an integral, laterally projecting, extension 30' which is connected to the pixel electrode 18. The pixel electrode 18 may be of metal (for a reflective display) or ITO (for a transmissive display).

The TFTs of the array of pixels are fabricated simultaneously, and together with the sets of address conductors, from common thin film layers deposited on the substrate 20 using conventional PECVD and photolithographic processes as well known in the field of fabricating thin film electronic elements forming active matrix circuits on large area insulating substrates. In this example, the TFTs comprise polycrystalline silicon TFTs, although other semiconductor materials, such as amorphous silicon or plastic organic material, may be used instead, as will be apparent to skilled persons. A polymer dielectric material could be used instead for the insulating and dielectric layers and PEDOT material could be used as the transparent conducting material rather than ITO.

The structure of the substrate 20 is adapted to facilitate mechanical bending or flexing of the substrate and, more particularly, to encourage the substrate to flex preferentially at selected areas away from the islands of the semiconductor devices. Referring again to FIGS. 3 and 4, then selected areas of the substrate 20 spaced from the island are deliberately formed comparatively weak for this purpose. In this embodiment, the selected, physically weakened, areas comprise a set of strips 50 forming lines of weakness, each formed by localised thinning of the substrate 20 to produce a linear recess, in the form of a trench with sloping sidewalls 51, on the outside of the substrate which extends completely across the substrate generally parallel to the column address conductors 16 and which is situated approximately mid-way between an adjacent pair of column address conductors underlying a column of pixel electrodes 18. The overall width of the trench 50, including the sidewalls, is slightly less than the width of the pixel electrode 18 and it will be appreciated, therefore, that the edges of the trench are spaced laterally from the thin film islands constituting the TFTs 12 whose underlying portions of the substrate are of full thickness.

The series of parallel trenches 50 provided between adjacent pairs of conductors 16 in this manner enable the substrate 20 with the active matrix circuit thereon to be rolled in a cylindrical sense around an axis extending generally parallel to the columns with less risk of damage being caused to the semiconductor devices 12. When rolling in this way, the substrate 20 will tend to flex along the weaker regions, i.e at the lines of weakness. Only the pixel electrodes 18 and portions of the row address conductors are present at these regions and because these components are more able to withstand the effects of such bending and unlikely to suffer peeling or cracking. The thin film layers constituting the TFTs, on the other hand, are supported on full thickness substrate regions and thus will experience significantly less flexing.

If, alternatively, curving of the display device in a cylindrical sense around an axis generally parallel to the row address conductors 14 is required, then the series of trenches in the substrate 20 can be provided instead extending completely across the substrate in similar fashion in the row direction, as shown at 52 in FIG. 3, with each trench being positioned away from the TFT islands, preferably around mid-way between adjacent pairs of row address conductors 14. Again, when being rolled in a cylindrical sense, the substrate 20 will tend to flex preferentially at the weakened regions rather than at the locations of the TFTs and the circuitry will largely be able to accommodate such flexing without harm as the only circuit elements likely to be affected, namely the pixel electrodes and portions of the column address conductors, are capable of tolerating a certain amount of flexing.

With both series of trenches 50 and 52 being provided together then the substrate is more capable of being formed into more complicated shapes without risk of the TFT structures being damaged. In particular, the two sets of trenches extending in perpendicular directions enable the substrate with the circuitry thereon to be curved more readily in two directions, for example for moulding or temporarily bending into a part spherical shape. When moulded or flexed into such a shape, the larger dimensional changes caused by the resulting deformation of the substrate will tend to be confined to relatively bare regions of the substrate away from the thin film islands of the TFT structures so that damage to the semiconductor and dielectric layers in particular of these structures is avoided.

The patterning of the deposited insulating and dielectric materials into islands at the regions of the TFTs avoids problems which could be caused if these layers were instead left extending more generally as they could tend to crack when the substrate bends. If more extensive coverage is required then polymer dielectric materials could be employed instead and afford greater flexibility.

The trenches 50 and 52 are here formed after fabrication of the thin film active matrix circuitry on the substrate 20 by a photolithographic patterning and etching process.

Figure 6:
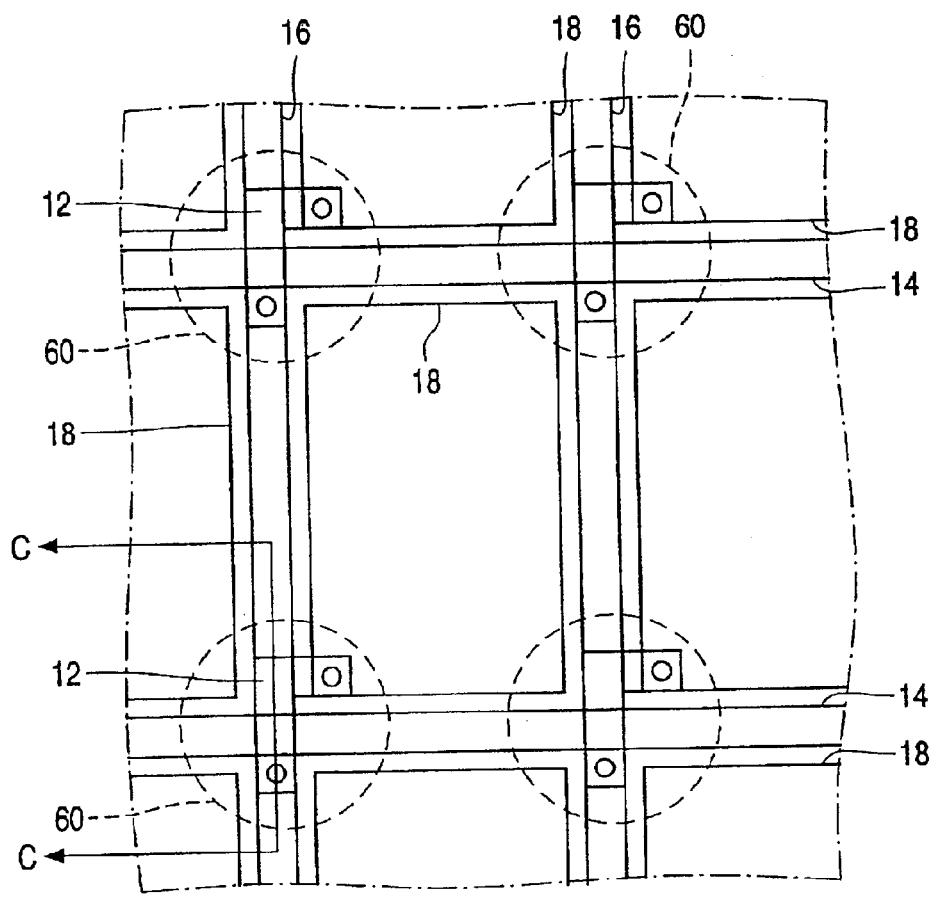
FIG. 6 is a plan schematic view of part of the active matrix substrate in a second embodiment of active matrix liquid crystal display device using the present invention.
Figure 7:
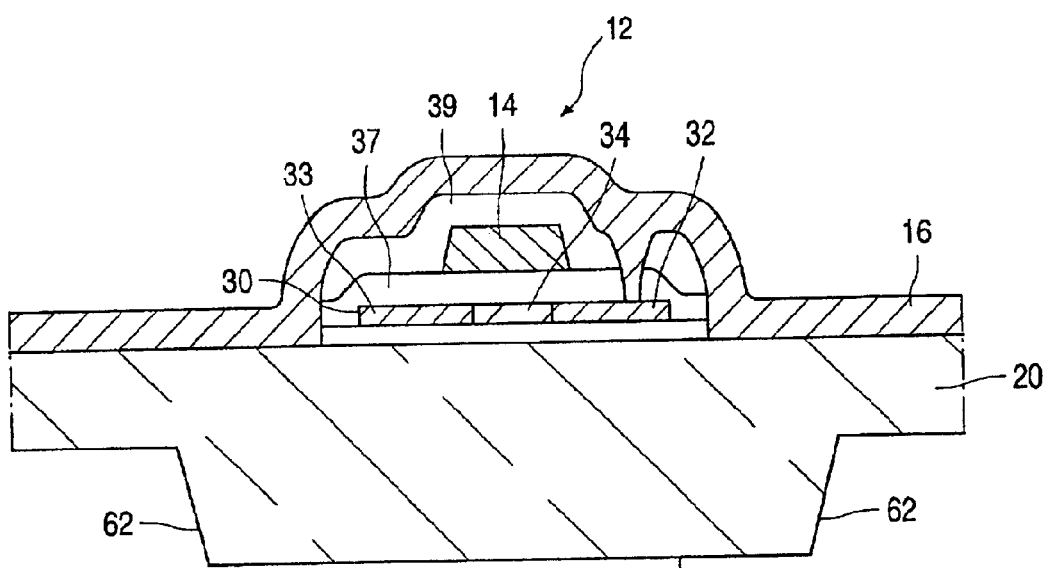
FIG. 7 is a cross sectioned view along the line C—C of FIG. 6.

A second exemplary embodiment of active matrix display device is shown in FIG. 6 which shows schematically in plan view a part of the active matrix substrate of the device and in FIG. 7 which is cross-sectional view along the line C—C of FIG. 6. The active matrix circuit structure carried on the substrate 20 is identical to that of the previous embodiment and the principal difference lies with the manner in which the substrate 20 is modified so as to encourage flexing of the substrate only at regions removed from the locations of the TFT structures and in relatively bare areas of the substrate when bending. To this end, the substrate is deliberately made weaker at all regions other than at those areas immediately beneath the TFTs by thinning the substrate 20 completely over its area except at those regions. As can be seen from FIG. 7, therefore, the thickness of the substrate 20 at the regions 60 directly underlying the thin film layer islands constituting the TFTs is greater than the substrate thickness elsewhere. Preferably, the thicker regions 60 are substantially circular in shape, as shown by the dotted lines in FIG. 6, rather than conforming with the actual shape of the thin film islands, which assists in achieving more uniform distortion of the surrounding substrate when bending, for example, into a part spherical shape. The thicker regions are dimensional slightly greater than the TFT structure such that they extend slightly beyond the area occupied by the semiconductor island and have a sloping (tapered) sidewall, 62, which helps prevent the metal address conductors from breaking when flexing the substrate.

The thickness of the substrate 20 other than at the regions 62 may be similar to that normally used for conventional polymer substrates with the increased thickness at the regions 60 then serving a stiffening function to discourage substrate flexing within these regions. Alternatively, the thickness at the regions 60 may be similar to that normally used. By way of example, the polymer substrate 20 may have an overall thickness of around 100–200 μm with the thinned regions, for example the regions 50 and 52, being around 50–100 μm.

In both the above-described embodiments, parts of the deposited semiconductor and dielectric thin film layers used in the formation of the TFTs are removed from the substrate except at the regions of the TFTs. However, this may not be essential and areas of these layers which are not required for the TFTs could be left in order perhaps to simplify device fabrication, although of course these unused areas could be subject to cracking upon bending of the substrate.

Figure 8:
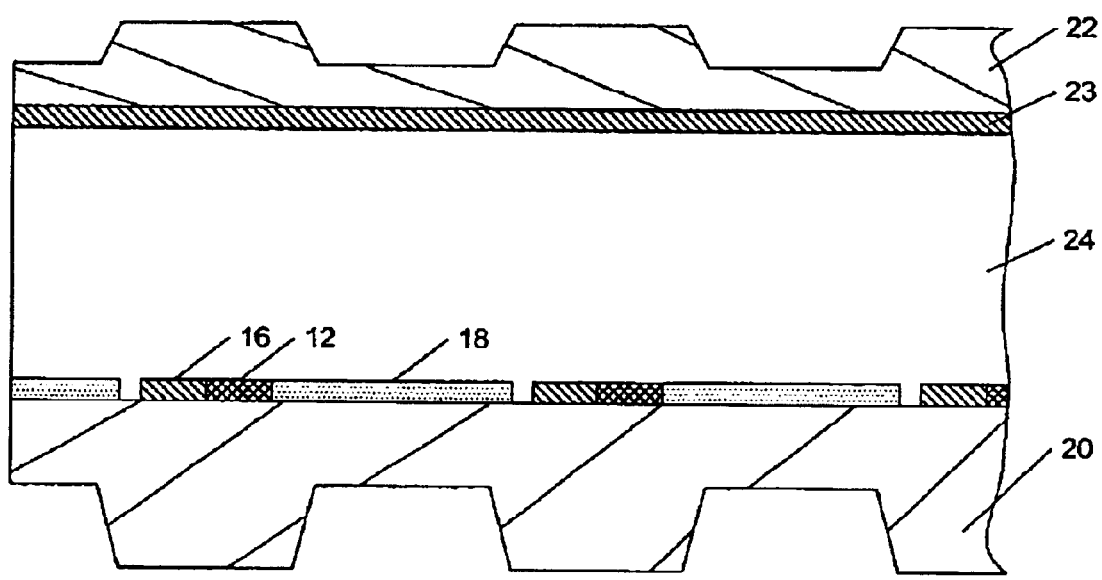
FIG. 8 illustrates an example active matrix liquid crystal display in accordance to one aspect of this invention.

The second substrate 22 of the device, carrying the continuous common electrode 23, preferably has a thickness less than that of the substrate 20 so that it exhibits generally greater flexibility. For a colour display device using an array of colour filter elements associated with the array of pixels electrodes, the colour filter element array may be carried on the substrate 22 but preferably is provided on the substrate 20. A similar technique could be applied to the substrate 22 to form lines of weakness in the row and/or column directions which lines are arranged to overlie regions between adjacent rows and/or columns of pixel electrodes 18 on the substrate 20, as illustrated in FIG. 8.

Although in the above embodiments TFTs are used as the active devices of the matrix array, it will be appreciated that other active devices, for example semiconductor thin film diodes, may be used instead as is also described in the aforementioned paper by N D Young et al. With such two-terminal, non-linear, type active devices then only one set of address conductors, for example the row conductors, are provided on the active matrix substrate and the second substrate carries the other set in the form of parallel strips of transparent conductive material, each of which overlies a respective column of pixel electrodes. In this case, when providing two sets of perpendicular lines of weakness, one set can be arranged to extend parallel with the row conductors approximately mid-way across the pixel electrodes while the other set can be arranged to extend between adjacent columns of pixel electrodes or towards the middle of a column of pixel electrodes depending on the location of the active devices.

As mentioned previously, the substrate 20 may be modified so as to confine any significant flexing or distortion when being bent to regions away from the active devices other than by localised thinning or thickening as in the above embodiments. Regions of the polymer material of the substrate may have their mechanical or thermal properties altered instead of this thinning or thickening or in combination with such. Thus, for example, the mechanical properties of the polymer material of the substrate 20 may be modified such that it becomes stiffer at selected regions in order to assist differential bending. With reference to the previous embodiments, then such stiffening may be applied to areas of the polymer substrate material other than at strip-shape portions extending over the rows and/or columns of pixel electrodes and generally corresponding to the locations of the recesses 50 and/or 52 (FIG. 3), or to portions of the polymer substrate material lying beneath the active devices, corresponding to the portions 60 (FIG. 6).

In another example, selected regions of the polymer substrate 20 may be modified by having the softening point of the material increased relative to the rest of the substrate in order to assist differential moulding when forming the substrate into a curved shape. The regions of the substrate which are treated in this way can again correspond to the thickened regions 60 (FIG. 6) or may be areas of the substrate other than strip portions corresponding to the locations of the recesses 50 and/or 52 (FIG. 3).

The stiffening or increasing of the softening point can be affected by subjecting the polymer material selectively to radiation treatment as known in the art, for example using U-V cross-linking or ion beam bombardment.

Instead of stiffening the polymer material at selected regions the polymer material at regions where flexing is to be encouraged, for example corresponding to the areas of the recesses 50 and 52 and the portions 60, may be treated so as to render them softer, and thus more flexible, than portions underlying the active devices. The portions treated in this way then will tend to flex and distort more readily.

As an alternative to thinning of the substrate by removal of part of the thickness of a single polymer film, a laminated polymer substrate comprising two, or more, layers bonded together can be used, one layer of which is patterned after fabrication of the thin film circuitry to remove selected portions so as to form thin and thick regions. In a modification of this structure, the patterned (thinned) layer may be of comparatively stiff polymer while the other layer is formed from a polymer exhibiting highly elastic properties.

Certain components of the thin film circuitry carried on the substrate 20, such as the address conductors 14 and 16 and the pixel electrodes 18, are required to be able to withstand some deformation of the underlying substrate when being bent. Appropriate materials, especially for comparatively long features like the address conductors, include aluminium and dilute aluminium alloys which are particularly ductile. These materials can be used in conjunction with very thin layers of molydenum and/or chromium which, as is known in the art of thin film electronic circuit fabrication, are beneficial in view of their ability to act as wet etch stops and as contact layers. These less ductile metals may be used in specific, localised, areas such as contact regions for the active devices and formed in islands in similar manner to the semiconductor and dielectric thin film layers of the active devices.

It is envisaged that conductive materials exhibiting greater elasticity, for example conducting polymer spin-on materials or printable pastes can be utilised instead of metal for the address conductors.

While in the above-described embodiments polymer materials have been used to provide the substrates, it is envisaged that a flexible metal foil could be used instead with the areas of weakness being defined by localised thinning, for example by etching.

Although the invention has been described with reference to active matrix liquid crystal display devices in particular, it will be appreciated that it can be applied to similar advantage in matrix display devices using different display materials, for example electroluminescent materials, and in other types of matrix array devices of the kind having a regular array of matrix elements that include an active semiconductor device. Examples of the latter include large area image sensor, using photosensitive pixels comprising a photodiode or the like, active matrix touch sensing arrays, thin film data stores and memory devices. These different types of thin film electronic array devices need only use one substrate.

In summary of the disclosure, a matrix array device, for example, an active matrix display device, image sensor, or the like, comprises a matrix circuit carried on a flexible substrate which circuit includes an array of semiconductor devices, such as TFTs, occupying discrete areas. Selected regions of the substrate away from the semiconductor devices are formed as areas of weakness to encourage flexing of the substrate to occur preferentially at those regions upon bending of the device and so reduce the risk of damage to the semiconductor devices. The regions, for example, may comprise lines of weakness extending between the semiconductor devices and may be formed by localised thinning of the substrate or by treating the substrate material to modify its stiffness at predetermined areas.

From reading the present disclosure, other modifications will be apparent to persons skilled in the art. Such modifications may involve other features which are already known in the field of matrix array devices using compliant substrates and component parts therefor and which may be used instead of or in addition to features already described herein.

What is claimed is:

1. A flexible matrix array device comprising
   a thin film matrix circuit carried on the surface of a flexible substrate which matrix circuit includes:
      semiconductor devices arranged in a regular array and occupying respective first areas of the substrate, and
      pixel electrodes corresponding coupled to each of the semiconductor devices and occupying respective second areas of the substrate;
   wherein
   the substrate is configured such that flexing of the substrate occurs more readily at the second areas than at the first areas.

2. A device according to claim 1, wherein
   the second areas comprise locally thinner regions of the substrate.

3. A device according to claim 2, wherein
   the locally thinner regions are formed by selective etching of the substrate.

4. A device according to claim 2, wherein
   the substrate comprises a laminated structure with at least two layers and in which one layer is patterned to form the locally thinner regions.

5. A device according to claim 1, wherein
   the second areas comprise areas of the substrate at which the material of the substrate is rendered less stiff compared with the first areas of the substrate.

6. A device according to claim 1, wherein
   the substrate comprises polymer material.

7. A device according to claim 1, wherein
   the second areas include lines that facilitate flexing of the substrate between the first areas of the substrate.

8. A device according to claim 7, wherein
   the semiconductor devices are arranged in an array of rows and columns and wherein
   the second areas comprise lines that facilitate flexing of the substrate extending across the array between rows and/or columns of semiconductor devices.

9. A device according to claim 1, wherein
   the first areas are thicker than the second areas of substrate.

10. A device according to claim 1, wherein
    the semiconductor devices each comprise a semiconductor film formed into an island.

11. A device according to claim 1, wherein
    the semiconductor devices comprises thin film transistors.

12. A device according to claim 1, wherein
    the device comprises
       an active matrix display devices having an array of display pixels.

13. A device according to claim 12, wherein
    the device comprises
       an active matrix liquid crystal display device which includes
       a further flexible substrate mounted to the substrate carrying the matrix circuit with liquid crystal material disposed between the substrates.

14. A device according to claim 13, wherein the further substrate has lines that facilitate flexing formed therein.

15. A curved matrix array device comprising a thin film matrix circuit carried on the surface of a substrate which matrix circuit includes:
  semiconductor devices arranged in a regular array and occupying respective first areas of the substrate, and
  pixel electrodes correspondingly coupled to each of the semiconductor devices and occupying respective second areas of the substrate;

wherein the substrate is configured such that curvature of the device is accommodated substantially by deformation at the substrate at the second areas.

* * * * *